US010726908B2

(12) United States Patent
Jeloka et al.

(10) Patent No.: US 10,726,908 B2
(45) Date of Patent: Jul. 28, 2020

(54) SWITCHED SOURCE LINES FOR MEMORY APPLICATIONS

(71) Applicant: Arm Limited, Cambridge (GB)

(72) Inventors: Supreet Jeloka, Austin, TX (US);
Pranay Prabhat, Cambridge (GB);
James Edward Myers, Bottisham (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/107,707

(22) Filed: Aug. 21, 2018

(65) Prior Publication Data

US 2020/0066358 A1 Feb. 27, 2020

(51) Int. Cl.
| | | |
|---|---|---|
| *G11C 11/418* | (2006.01) | |
| *G11C 5/06* | (2006.01) | |
| *G11C 7/12* | (2006.01) | |
| *G11C 7/18* | (2006.01) | |
| *G11C 8/08* | (2006.01) | |
| *G11C 11/4091* | (2006.01) | |
| *G11C 8/14* | (2006.01) | |
| *G11C 8/16* | (2006.01) | |
| *G11C 16/28* | (2006.01) | |

(52) U.S. Cl.
CPC ............ *G11C 11/418* (2013.01); *G11C 5/063* (2013.01); *G11C 7/12* (2013.01); *G11C 7/18* (2013.01); *G11C 8/08* (2013.01); *G11C 11/4091* (2013.01); *G11C 8/14* (2013.01); *G11C 8/16* (2013.01); *G11C 16/28* (2013.01)

(58) Field of Classification Search
CPC ........... G11C 16/28; G11C 5/063; G11C 7/18; G11C 8/08; G11C 8/14; G11C 8/16; G11C 11/4091; G11C 7/12; G11C 11/412
See application file for complete search history.

(56) References Cited

U.S. PATENT DOCUMENTS

| | | | | |
|---|---|---|---|---|
| 6,141,255 | A | 10/2000 | Sunkavalli | |
| 9,373,389 | B2 * | 6/2016 | Yamamoto | G11C 8/16 |
| 9,691,496 | B1 * | 6/2017 | Kohli | G11C 17/126 |
| 2005/0276094 | A1 * | 12/2005 | Yamaoka | H01L 27/11 |
| | | | | 365/154 |
| 2016/0118108 | A1 * | 4/2016 | Yamamoto | G11C 8/16 |
| | | | | 365/154 |

FOREIGN PATENT DOCUMENTS

CN 107393584 A 11/2017

OTHER PUBLICATIONS

Chakraborty, et al.; Optimizing VMIN of ROM Arrays without Loss of Noise Margin; GLSVLSI '15; ACM; May 2015. DOI: 10.1145/2742060.2742100.

(Continued)

*Primary Examiner* — David Lam

(74) *Attorney, Agent, or Firm* — Pramudji Law Group PLLC; Ari Pramudji

(57) ABSTRACT

Various implementations described herein refer to an integrated circuit having a memory structure with an array of bitcells accessible via wordlines arranged in rows and bitlines arranged in columns. The integrated circuit may include source lines coupled to the bitcells. The integrated circuit may include source line drivers coupled between the wordlines and the source lines, and the source line drivers may allow the source lines to be used as switched source lines.

20 Claims, 7 Drawing Sheets

(56) References Cited

OTHER PUBLICATIONS

Umemoto, et al.; A 28 nm 50% Power Reduced 2T Mask ROM with 0.72 ns. Read Access Time Using Column Source Bias; 2011 IEEE CICC; IEEE; 2011. DOI: 10.1109/CICC.2011.6055317.
PCT International Search Report and Written Opinion; PCT/GB2019/052270; dated Nov. 7, 2019.

* cited by examiner

SWITCHED SOURCE LINES FOR MEMORY APPLICATIONS

STATEMENT AS TO FEDERALLY-SPONSORED RESEARCH

This invention was made with Government support under Agreement No. HR0011-17-9-0025, awarded by DARPA. The Government has certain rights in the invention.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional memory applications, low power/energy systems typically use a low voltage of operation for memory. However, at low voltage of operation, conventional memory read margins may collapse, as worst (min) on-current (Ion) with variations may be equal or lower than worst (max) m-off-current (m*Ioff). Generally, on-current (Ion) refers to the current (I) on a bitline of a selected bitcell, and off-current (Ioff) refers to leakage current from unselected bitcells on the same bitline. For a memory array, where (m+1) bitcells share a bitline in a column, the worst case off-current is cm' times Ioff, which may make read logic '0' and read logic '1' indistinguishable. Assuming bitcell size may be already optimized for (Ion/Ioff) for a given area, to achieve low Vmin of operation, 'm' needs to be significantly reduced, which may lead to shorter columns, and consequently smaller banks, and hence lower density of memory.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to switched source lines for various memory applications. For instance, some implementations described herein are directed to switched source lines (SSLs), data encoded, low minimum voltage (Vmin) memory applications, such as, e.g., read-only memory (ROM). Some implementations described herein may provide for embedded via-programmable ROM circuitry that may achieve the low minimum voltage (Vmin) of operation with data encoding to thereby assist with improve read speed.

Various implementations described herein use a switched source Line (SSL) to reduce Ioff from unselected rows. The Ioff (leakage current) from unselected bitcells on the same shared bitline reduces resolution between reading a logic '0' or a logic '1' such that Ioff may reduce read margin and consequently reduces robustness of the memory read under different operating conditions and/or variations. This SSL technique involves driving the source line (SL) as an inverse of the wordline (WL). This may ensure that the bitlines can be pulled down using the on-current (Ion), or stay precharged, depending on the state stored in the bitcells of the selected row, i.e., the active wordline (WL=1, SL=0), while the other unselected (WL=0, SL=1) row bitcells sharing the same bitlines do not leak down, because they have their source line tied high. Hence, this SSL technique may improve the read margin from conventional (Ion/(m*Ioff)) to (Ion/Ioff), to thereby have one or more or several bits per bitline (BL) limited only by read speed, and thus allowing for higher density, low Vmin ROM.

Some implementations described herein are directed to differential read ROM with a single transistor bitcell. For instance, some implementations described herein may provide an embedded via-programmable ROM circuit with differential read using a single transistor bitcell to achieve a low minimum voltage (Vmin) of operation or high speed. As such, some implementations described herein may use the switched source line (SSL) to reduce Ioff from unselected rows, and also, some implementations described herein may use differential read to improve read margins.

Various implementations of switched source line (SSL) circuitry for memory applications will now be described in detail herein with reference to FIGS. 1A-4.

Figure 1A:
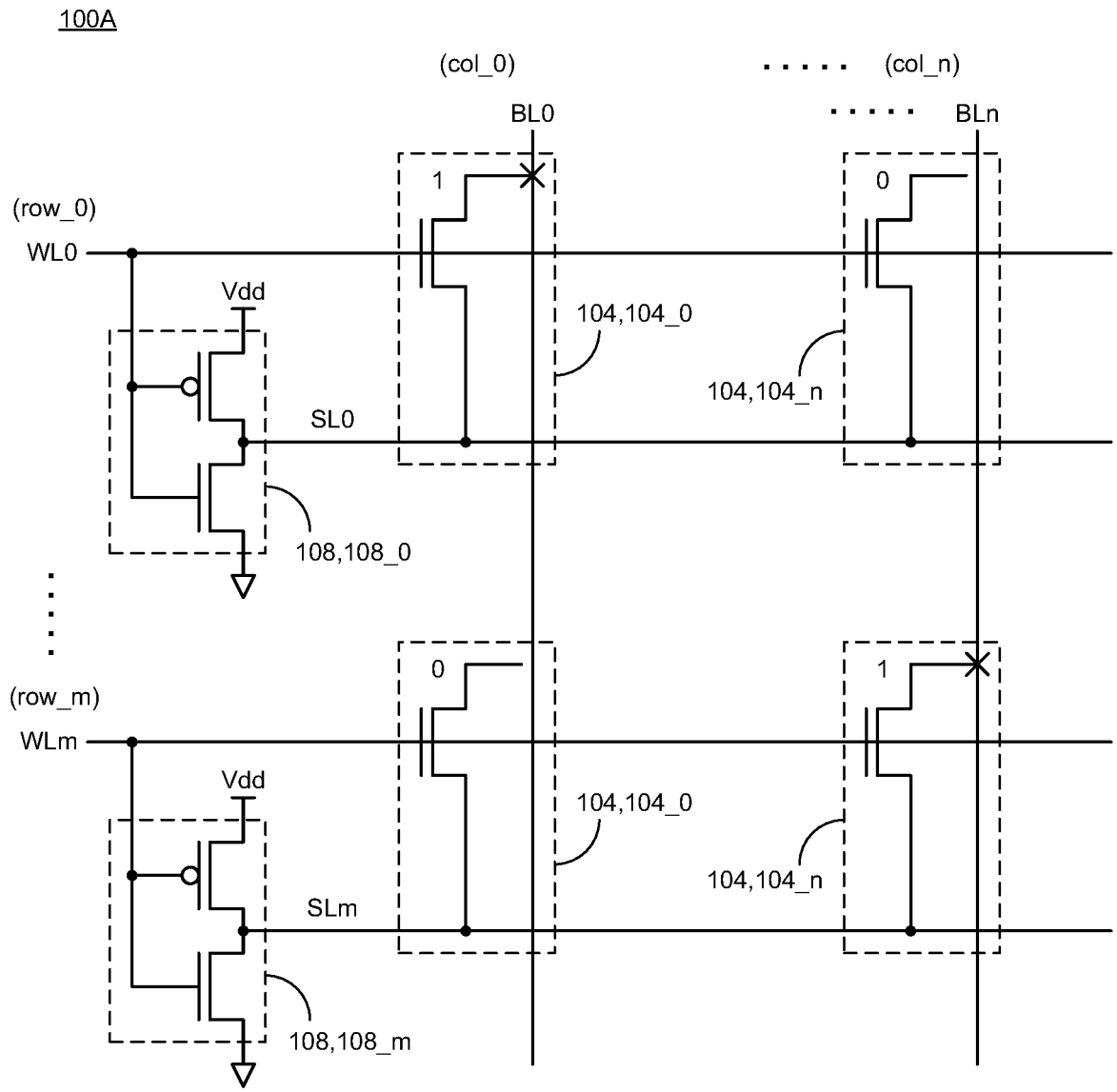
FIGS. 1A-1C illustrate diagrams of memory circuitry having switched source lines in accordance with various implementations described herein.
Figure 1B:
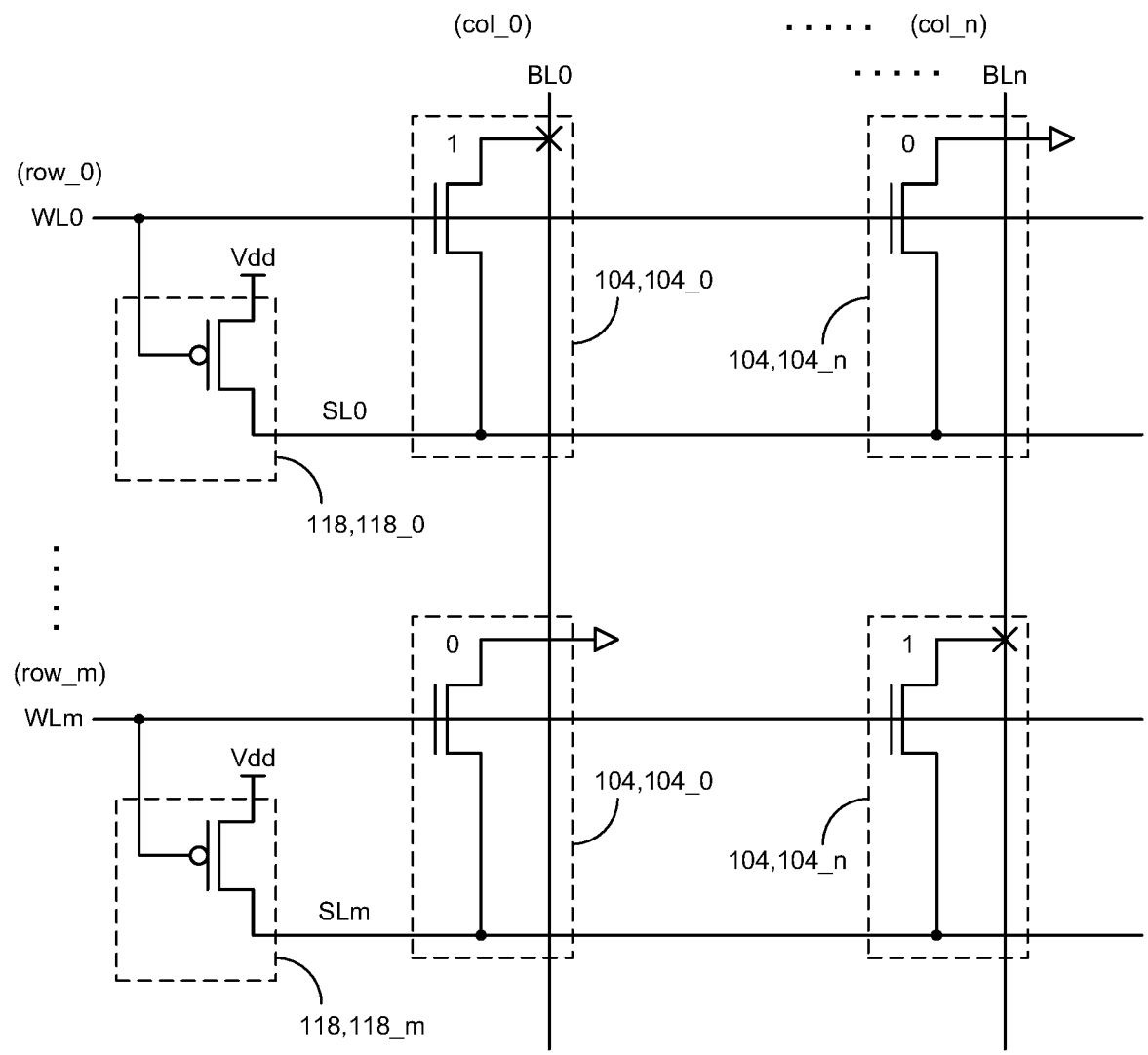
Figure 1C:
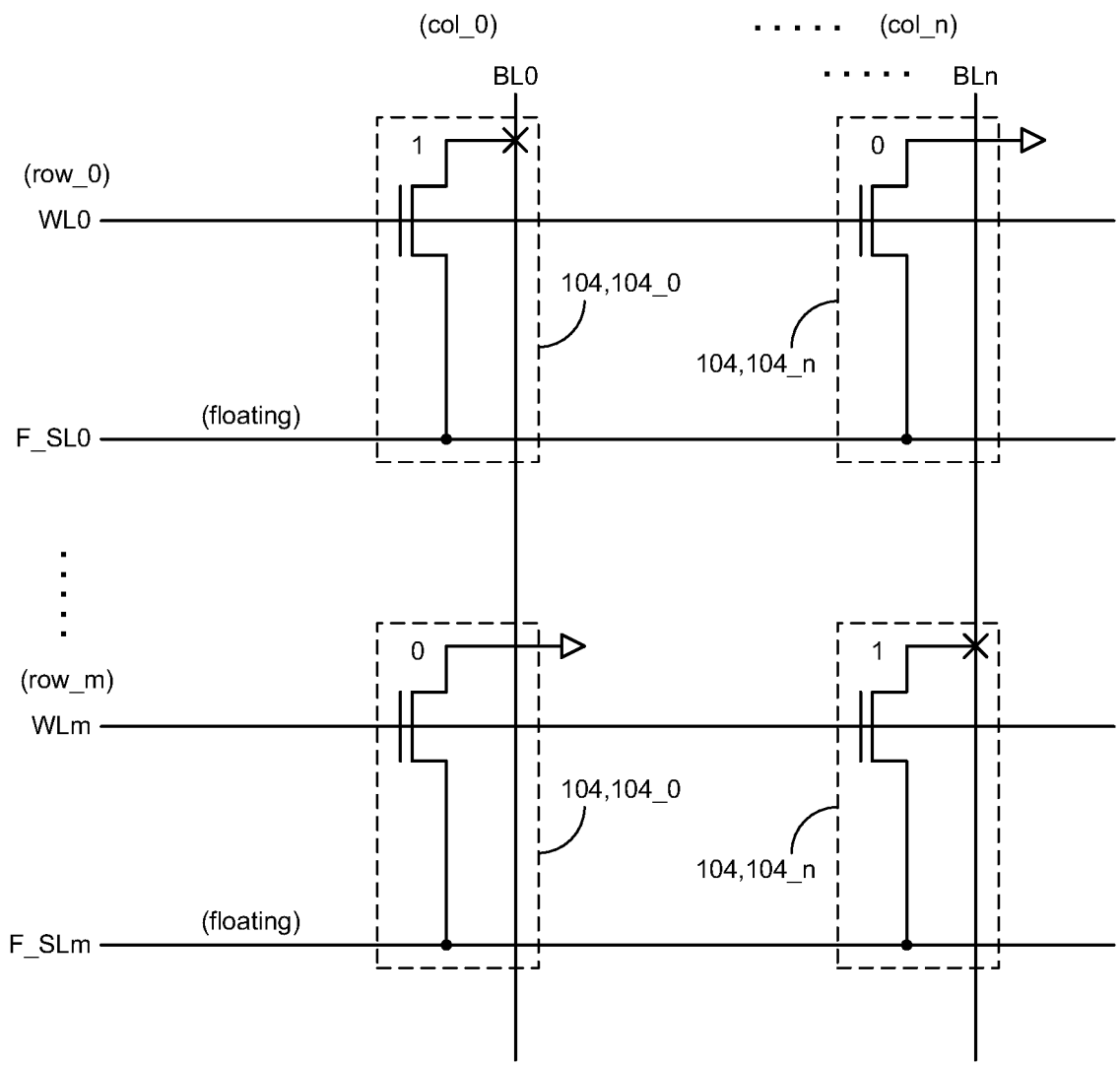

FIGS. 1A-1C illustrate diagrams of memory circuitry 100A, 100B, 100C having switched source lines (SSLs) in accordance with implementations described herein. In particular, FIG. 1A shows memory circuitry 100A with switched source lines (SSLs) and source line drivers 108, FIG. 1B shows memory circuitry 100B with switched source lines (SSLs) and other source line drivers 118, and FIG. 1C shows memory circuitry 100C with floating switched source lines (SSLs).

As shown in FIG. 1A, the memory circuitry 100A may be implemented with a memory structure having an array of bitcells 104 that are accessible via a number (m+1) of wordlines (WL0 . . . WLm) and a number (n+1) of bitlines (BL0 . . . BLn). The wordlines (WL0 . . . WLm) may be arranged in the number (m+1) of rows (row_0 . . . row_m), and the bitlines (BL0 . . . BLn) may be arranged in the number of columns (col_0 . . . col_n).

In some instances, the memory structure may be implemented as a read-only memory (ROM) structure, and the array of bitcells 104 may be implemented as a ROM array. For instance, as shown in FIGS. 1A-1C, each bitcell 104 in the array of bitcells may be implemented with a single transistor that is coupled between a corresponding bitline (BL) of the bitlines (BL0 . . . BLn) and a corresponding source line (SL) of the source lines (SL0 . . . SLm). In some cases, as shown, the single transistor may be implemented with a single n-type metal-oxide-semiconductor (NMOS) transistor. In other cases, the single transistor may be implemented with a single p-type MOS (PMOS) transistor.

Figure 2A:
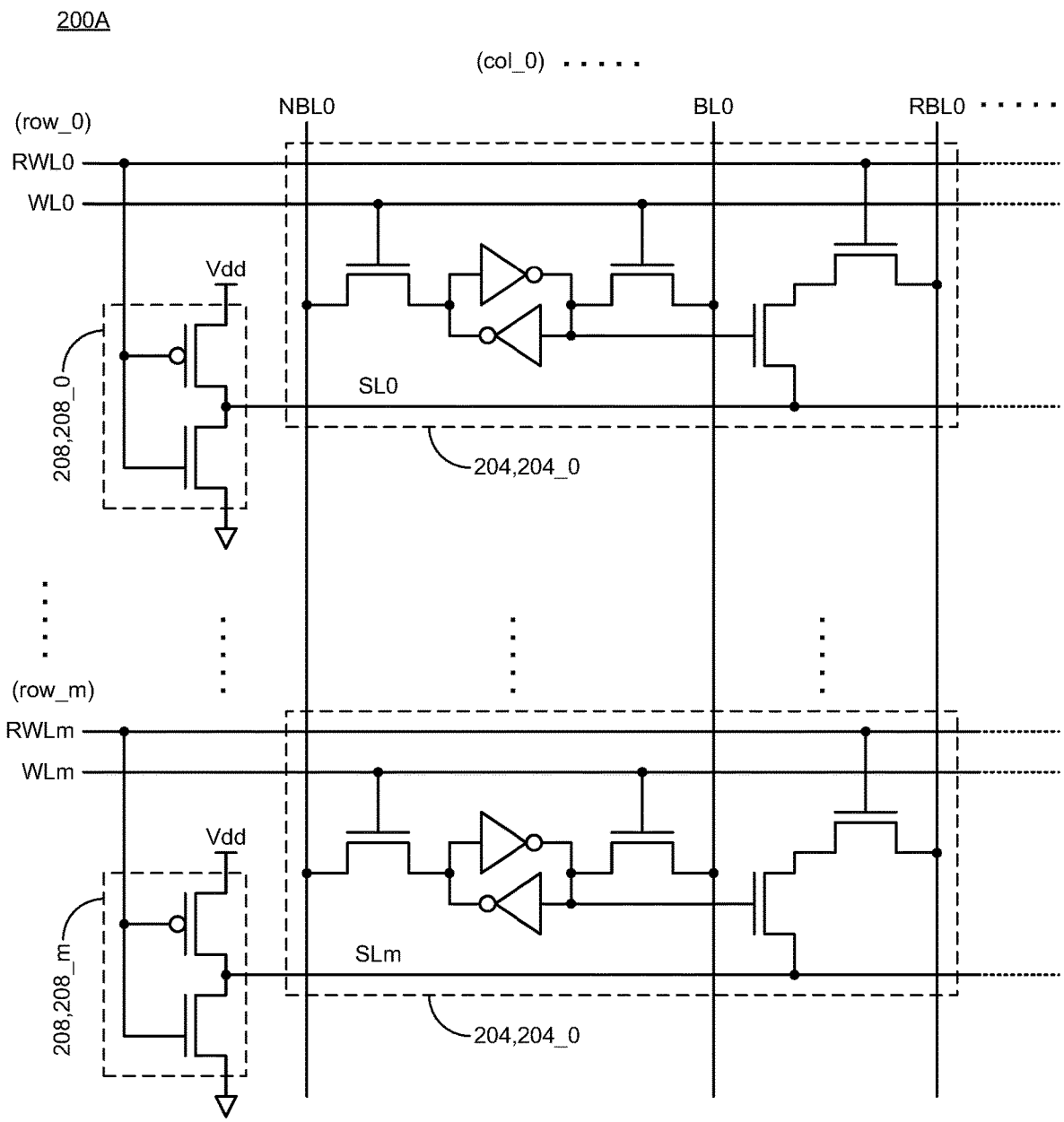
FIGS. 2A-2B illustrate diagrams of memory circuitry having switched source lines in accordance with various implementations described herein.
Figure 2B:
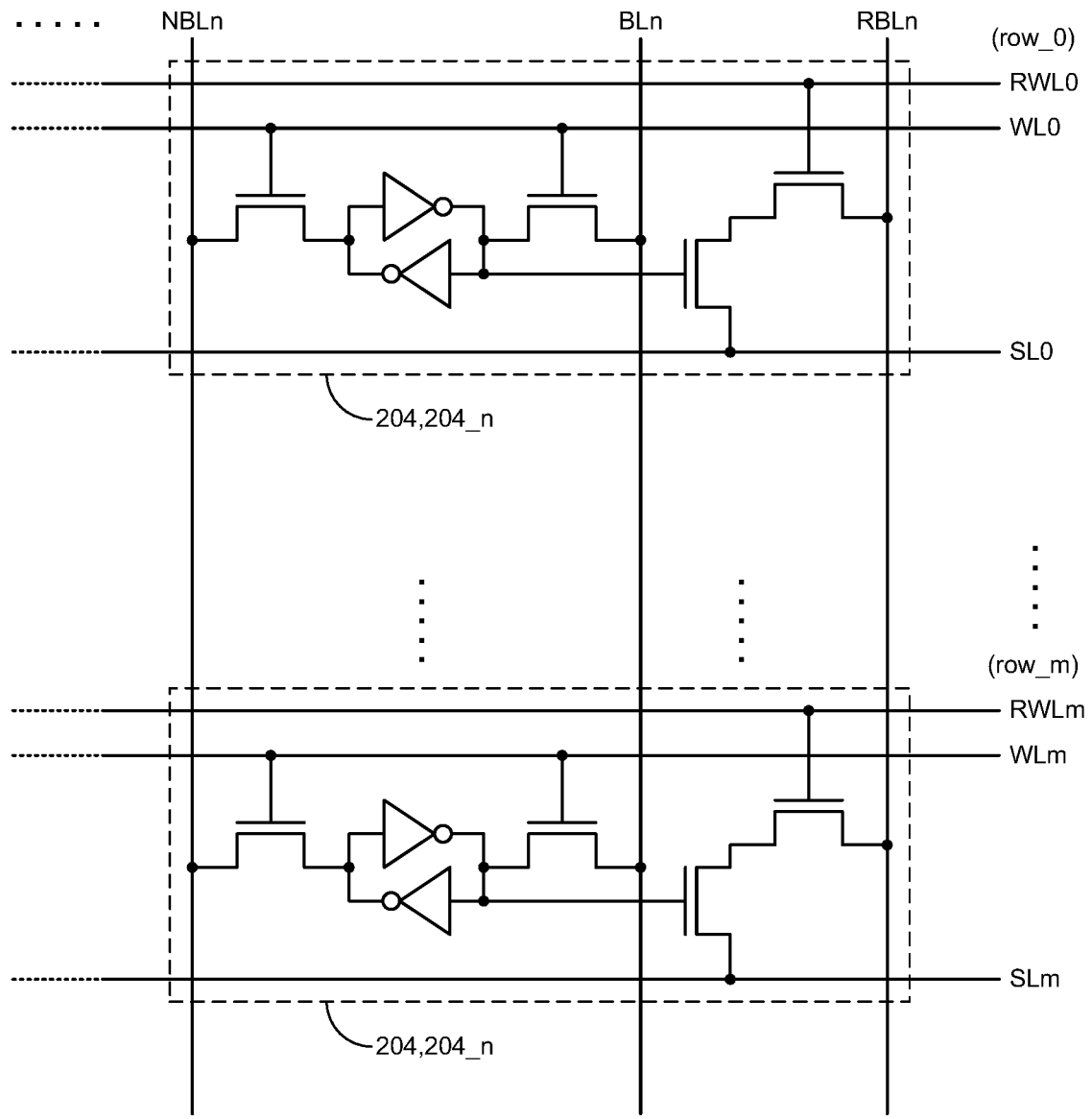

In other instances, the memory structure may be implemented as a random access memory (RAM) structure, and the array of bitcells 104 may be implemented as a RAM array, such as, e.g., static RAM (SRAM). For instance, as shown in FIGS. 2A-2B, the memory structure may be implemented as an SRAM structure, and the array of bitcells 104 may be implemented as an SRAM array.

The memory circuitry 100A may include the number (m+1) of source lines (SL0 . . . SLm) that are coupled to the bitcells 104. Also, the memory circuitry 100A may include the number (m+1) of source line drivers 108 (i.e., 108_0 . . . 108_m) that are coupled between the wordlines (WL0 . . . WLm) and the source lines (SL0 . . . SLm). In some instances, the source line drivers (108_0 . . . 108_m) may allow the source lines (SL0 . . . SLm) to be used as switched source lines (SSLs).

In some instances, as shown in FIG. 1A, the source line drivers (108_0 . . . 108_m) may be implemented with various types of logic devices. For instance, as shown in FIG. 1A, the logic devices may be implemented with inverters 108. As shown in memory circuitry 100B of FIG. 1B, the logic devices may be implemented with a single transistor 118 (i.e., 118_0 . . . 118_m), such as, e.g., a single PMOS transistor. Alternately, the single transistor 118 may be implemented with a single NMOS transistor, if the bitline (BL) is pre-discharged.

In some instances, each row (row) of the rows (row_0 . . . row_m) may include the number (n+1) of bitcells 104 (i.e., 104_0 . . . 104_n), a corresponding source line (SL) of the source lines (SL0 . . . SLm), and a corresponding source line driver (SLD) of the source line drivers (108_0 . . . 108_m). In other instances, each row (row) of the rows (row_0 . . . row_m) may be implemented with a single source line driver (SLD) of the source line drivers (108_0 . . . 108_m) that is coupled to a single source line (SL) of the source lines (SL0 . . . SLm) between a single wordline (WL) of the wordlines (WL0 . . . WLm) and the number (n+1) of bitcells 104 (i.e., 104_0 . . . 104_n).

In some instances, each bitcell 104 in the array of bitcells is coupled between a corresponding source line (SL) of the source lines (SL0 . . . SLm) and a corresponding bitline (BL) of the bitlines (BL0 . . . BLn). Also, each bitcell 104 in the array of bitcells may store a logic data value of one (1) with a short (X) between each bitcell 104 and the corresponding bitline (BL), and each bitcell 104 in the array of bitcells may store another logic data value of zero (0) with an open (i.e., gap) between each bitcell 104 and the corresponding bitline (BL).

In some implementations, the wordlines (WL0 . . . WLm) include active wordlines and inactive wordlines, and an initial condition of the source lines (SL) of the inactive wordlines may be similar to an initial condition of any one bitline (BL) of the bitlines (BL0 . . . BLn). In other implementations, the source line drivers (SLDs) may operate to reduce leakage of the bitcells 104 (104_0 . . . 104n) so as to increase a read margin associated with read operations of the bitcells 104 (104_0 . . . 104n), and the increase in read margin may be associated with at least one of an off-current through the bitlines (BL0 . . . BLn) and/or a precharge voltage of the bitlines (BL0 . . . BLn).

Figure 3:
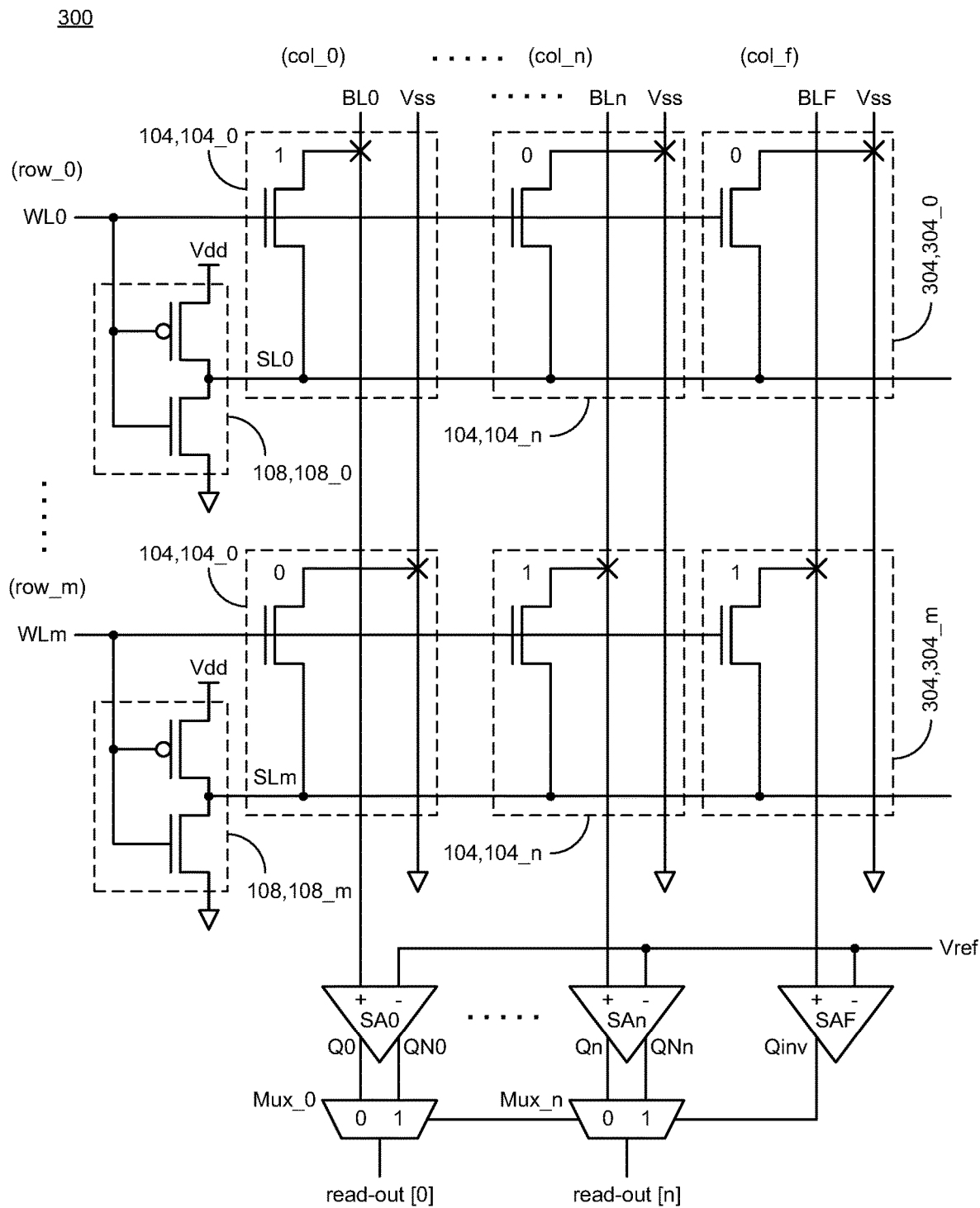
FIG. 3 illustrates another diagram of memory circuitry having switched source lines in accordance with various implementations described herein.

In some implementations, in reference to FIG. 1A, switched source line ROM may improve Vmin and lengthen access time. This SSL technique may improve Vmin of the ROM, but may adversely impact the read speed. Sometimes, read access time may be affected by discharge of the BL capacitance, and pull-down current for the discharge of the BLs may be limited by the transistor in the selected row's SL driver 108. To mitigate this slow down issue, the uncontacted bits representing a '0' may be connected between the SL and VSS, e.g., as shown in FIG. 3. In some instances, in each physical row, an inversion flag may be stored, as also described in FIG. 3. As will be described herein below, the inversion flag may be set if: 'count of 1-bits' in a physical row>'count of 0-bits' in a physical row, and the complement of the data is stored in a corresponding row. Also, a small 4×4 data encoding example (i.e., Matrix 1) is shown herein below in reference to FIG. 3.

In some implementations, as shown in FIG. 1B, the memory circuitry 100B may be implemented with a memory structure having the array of bitcells 104 that are accessible via wordlines (WL0 . . . WLm) arranged in rows (row_0 . . . row_m) and bitlines (BL0 . . . BLn) arranged in columns (col_0 . . . col_n). The memory circuitry 100B may have a single transistor 118 that is coupled to the bitcells 104. In this instance, each bitcell 104 in the array of bitcells may be coupled between a corresponding source line (SL) and a corresponding bitline (BL).

In some implementations, in reference to FIG. 1B, the NMOS transistor of the SL drivers 118 may be removed, and thus, the 0-storing bits may provide the pull-down functionality without use of a full inverter, as shown in FIG. 1A. As shown, the 0-storing bits may provide the pull-down functionality with a short between each bitcell and ground (Vss). Also, the pull-up may ensure SL=1 for unselected rows, and thus, the memory circuitry 100B may have a same or substantially similar Vmin improvement.

In some implementations, as shown in FIG. 1C, the memory circuitry 100C may be implemented with a memory structure having the array of bitcells 104 that are accessible via wordlines (WL0 . . . WLm) arranged in rows (row_0 . . . row_m) and bitlines (BL0 . . . BLn) arranged in columns (col_0 . . . col_n). The memory circuitry 100C may have floating source lines (F_SL0 . . . F_SLm) that are coupled to the bitcells 104 (104_0 . . . 104n). In this instance, each bitcell 104 in the array of bitcells may be coupled between a corresponding floating source line (F_SL) of the floating source lines (F_SL0 . . . F_SLm) and a corresponding bitline (BL) of the bitlines (BL0 . . . BLn).

In some implementations, in reference to FIG. 1C, the source line (SL) drivers may be undriven, i.e., the SL drivers may be removed, and thus, the source lines (SLs) may be floating. In this instance, for a selected row, the wordline (WL) may be asserted, and the 0-storing bits may couple (or connect) the SL to ground (VSS). Thus, as shown, the 0-storing bits may provide the pull-down functionality with a short between each bitcell and ground (Vss). Also, for unselected rows, the SL will be floating, which may lead to higher Ioff in the column during read, therefore eroding some of the Vmin gains. The advantage of this topology is that, if the SL is floating during standby mode (wherein one or more or all WL=0), then the standby leakage may be at a minimum.

Therefore, in reference to FIGS. 1A-1C, various implementations described herein may provide for memory circuitry and structures (e.g., ROM) with switched source lines (SSLs) to reduce the minimum voltage of operation (Vmin). Also, implementations described herein may provide for switched source line ROM with bits storing logic 0 that are used as local discharge paths and data encoding to improve speed.

The memory circuitry 100A, 100B, 100C may be implemented as an integrated circuit (IC) in using various types of memory, such as, e.g., read-only memory (ROM) or any other type of non-volatile memory. The memory circuitry 100A, 100B, 100C may be implemented as an IC with single or dual rail memory architecture. The memory circuitry 100A, 100B, 100C may be integrated with computing circuitry and related components on a single chip. The memory circuitry 100A, 100B, 100C may be implemented in embedded systems for various electronic and mobile applications, including low power sensor nodes for IoT (Internet of things) applications.

As shown in FIGS. 1A-1C, the memory circuitry 100A, 100B, 100C includes memory, such as, e.g., core circuitry having the array of bitcells. The array of bitcells may include any number of bitcells arranged in various configurations, such as, e.g., a two-dimensional (2D) memory array having any number of columns (col_n) and any number of rows (row_m) of multiple bitcells, which may be arranged in a 2D grid pattern with 2D indexing capabilities. As shown, each bitcell may be implemented with read-only memory (ROM) circuitry, and/or some other type of non-volatile type memory. In some instances, the memory circuitry 100A, 100B, 100C may operate at a source voltage level VDD with a voltage range that varies with technology.

FIGS. 2A-2B illustrate diagrams of memory circuitry 200 with switched source lines in accordance with various implementations described herein. In particular, FIG. 2A shows a first part 200A (or left-side part) of the memory circuitry 200, and FIG. 2B shows a second part 200B (or right-side part) of the memory circuitry 200.

As shown in FIGS. 2A-2B, the memory circuitry 200A, 200B is implemented with a memory structure having an array of bitcells 204 that are accessible via a number (m+1) of read-wordlines (RWL0 . . . RWLm) and wordlines (WL0 . . . WLm) and a number (n+1) of complementary bitlines (NBL0/BL0 . . . NBLn/BLn) and read-bitlines (RBL0 . . . RBLN). The read-wordlines (RWL0 . . . RWLm) and wordlines (WL0 . . . WLm) may be arranged in the number (m+1) of rows (row_0 . . . row_m), and the read-bitlines (RBL0 . . . RBLN) and the bitlines (BL0 . . . BLn) may be arranged in the number of columns (col_0 . . . col_n).

In some instances, the memory structure may be implemented as a random access memory (RAM) structure, and the array of bitcells 204 may be implemented as a RAM array. For instance, as shown in FIGS. 2A-2B, each bitcell 204 in the array of bitcells may be implemented with multiple transistors (e.g., 8T) that are coupled between complementary bitlines (NBL, BL, RBL) of multiple read/write bitlines (NBL0/BL0/RBL0 . . . NBLn/BLn/RBLn) and a corresponding source line (SL) of the source lines (SL0 . . . SLm). In some cases, as shown, the multiple transistors may be implemented with SRAM CMOS transistors, such as, e.g., both NMOS and PMOS transistors. In this instance, as shown in FIGS. 2A-2B, the memory structure may be implemented as an SRAM structure, and the array of bitcells 204 may be implemented as an SRAM array.

The memory circuitry 200A, 200B may include the number (m+1) of source lines (SL0 . . . SLm) that are coupled to the bitcells 204. Also, the memory circuitry 200A, 200B may include the number (m+1) of source line drivers 208 (i.e., 208_0 . . . 208_m) that are coupled between the read-wordlines (RWL0 . . . RWLm) and the source lines (SL0 . . . SLm). Also, some of the bitcell transistors of the bitcells 204 are coupled between the read-wordlines (RWL0 . . . RWLm) and the source lines (SL0 . . . SLm). In some instances, the source line drivers (208_0 . . . 208_m) may allow the source lines (SL0 . . . SLm) to be used as switched source lines (SSLs).

In some instances, as shown in FIGS. 2A-2B, the source line drivers (208_0 . . . 208_m) may be implemented with various types of logic devices. For instance, as shown in FIG. 1A, the logic devices may be implemented with inverters 208.

In some instances, each row (row) of the rows (row_0 . . . row_m) may include the number (n+1) of bitcells 204 (i.e., 204_0 . . . 204_n), a corresponding source line (SL) of the source lines (SL0 . . . SLm), and a corresponding source line driver (SLD) of the source line drivers (208_0 . . . 208_m). In other instances, each row (row) of the rows (row_0 . . . row_m) may be implemented with a single source line driver (SLD) of the source line drivers (208_0 . . . 208_m) that is coupled to a single source line (SL) of the source lines (SL0 . . . SLm) between a single wordline (WL) of the wordlines (WL0 . . . WLm) and the number (n+1) of bitcells 204 (i.e., 204_0 . . . 204_n).

In some instances, each bitcell 204 in the array of bitcells is coupled between a corresponding source line (SL) of the source lines (SL0 . . . SLm) and a corresponding bitline (NBL/BL/RBL) of the bitlines (NBL/BL0/RBL0 . . . NBLn/BLn/RBLn). Further, each bitcell 204 in the array of bitcells may store at least one data bit value (e.g., data value related to a logical '0' or '1').

In some implementations, the wordlines (RWL0/WL0 . . . RWLm/WLm) include active wordlines and inactive wordlines, and an initial condition of the source lines (SL) of the inactive wordlines may be similar to an initial condition of any one bitline (NBL/BL/RBL) of bitlines (NBL0/BL0/RBL0 . . . NBLn/BLn/RBLn). In other implementations, the source line drivers (SLDs) may operate to reduce leakage of the bitcells 104 (104_0 . . . 104n) so as to increase a read margin associated with read operations of the bitcells 104 (104_0 . . . 104n), and the increase in read margin may be associated with at least one of an off-current through the bitlines (NBL0/BL0/RBL0 . . . NBLn/BLn/RBLn) and/or a precharge voltage of the bitlines (NBL0/BL0/RBL0 . . . NBLn/BLn/RBLn).

The memory circuitry 200A, 200B may be implemented as an integrated circuit (IC) in using various types of memory, such as, e.g., random access memory (RAM) or any other type of volatile memory. The memory circuitry 200A, 200B may be implemented as an IC with single or dual rail memory architecture. The memory circuitry 200A, 200B may be integrated with computing circuitry and related components on a single chip. The memory circuitry 200A, 200B may be implemented in embedded systems for various electronic and mobile applications, including low power sensor nodes for IoT (Internet of things) applications.

As shown in FIGS. 2A-2B, the memory circuitry 200A, 200B includes memory, such as, e.g., core circuitry having the array of bitcells. The array of bitcells may include any number of bitcells arranged in various configurations, such as, e.g., a two-dimensional (2D) memory array having any number of columns (col_n) and any number of rows (row_m) of multiple bitcells, which may be arranged in a 2D grid pattern with 2D indexing capabilities. As shown, each bitcell may be implemented with random access memory (RAM) circuitry, and/or some other type of volatile type memory. In some instances, the memory circuitry 200A, 200B may operate at a source voltage level VDD with a voltage range that varies with technology.

FIG. 3 illustrates another diagram of memory circuitry 300 having switched source lines in accordance with implementations described herein. Various components that are described herein below in FIG. 3 are similar in scope, function, and operation as described in reference to the memory circuitry 100A as shown in FIG. 1A.

As shown in FIG. 3, the memory circuitry 300 may be implemented with a memory structure having an array of bitcells 104 that are accessible via the number (m+1) of wordlines (WL0 ... WLm) and the number (n+1) of bitlines (BL0 ... BLn). The wordlines (WL0 ... WLm) may be arranged in the number (m+1) of rows (row_0 ... row_m), and the bitlines (BL0 ... BLn) may be arranged in the number (n+1) of columns (col_0 ... col_n) along with ground lines (Vss). As shown, one or more bitcells 104 are coupled to the bitlines (BL0 ... BLn) with a short (X) to the bitlines (BL0 ... BLn), and one or more other bitcells 104 are coupled to the ground lines (Vss) with a short (X) to the ground lines (Vss).

In some instances, the memory structure may be implemented as a read-only memory (ROM) structure, and the array of bitcells 104 may be implemented as a ROM array. For instance, as shown in FIG. 3, each bitcell 104 in the array of bitcells may be implemented with a single transistor that is coupled between a corresponding bitline (BL) of the bitlines (BL0 ... BLn) and a corresponding source line (SL) of the source lines (SL0 ... SLm). In various instances, the single transistor may be implemented with a single NMOS transistor (as shown) or a single PMOS transistor.

The memory circuitry 100A may include the number (m+1) of source lines (SL0 ... SLm) that are coupled to the bitcells 104. Also, the memory circuitry 100A may include the number (m+1) of source line drivers 108 (i.e., 108_0 ... 108_m) that are coupled between the wordlines (WL0 ... WLm) and the source lines (SL0 ... SLm). In some instances, the source line drivers (108_0 ... 108_m) may allow the source lines (SL0 ... SLm) to be used as switched source lines (SSLs).

In some implementations, the array of bitcells 104 may include a column (col_f) of flag bitcells (304_0 ... 304_m), and the bitlines may include a flag bitline (BLF) for providing an inversion flag for data encoding with the column (col_f) of flag bitcells (304_0 ... 304_m). Also, the data encoding may provide for speeding-up the source lines (SL0 ... SLm). In some instances, as shown in FIG. 3, a single flag column (col_f) may be used for data encoding. However, in other instances, multiple flag columns may be used for data encoding with finer granularity. E.g., a physical row of 128 bits may have 4 logical words of 32 bits each, and thus, 4 flag bits may be used instead of 1 flag bit.

In some implementations, each bitcell 104 in the array of bitcells may be coupled between a corresponding source line (SL) of the source lines (SL0 ... SLm) and a corresponding bitline (BL) of the bitlines (BL0 ... BLn) or a corresponding ground line (Vss) of the ground lines (Vss). As shown, each bitcell 104 in the array of bitcells may store a logic data value of one (1) with a connection or short (X) between each bitcell 104 and the corresponding bitline (BL), and also, each bitcell 104 in the array of bitcells may store another logic data value of zero (0) with a connection or short (X) between each bitcell 104 and the corresponding ground line (Vss). The wordlines (WL0 ... WLm) may include active wordlines and inactive wordlines, and thus, the bitcells 104 that are coupled to ground lines (Vss) may provide zero-bit connections for local discharge of the source lines (SL0 ... SLm) that are coupled to active wordlines. As such, the zero-bit connections may provide for local discharge paths of the source lines to ground (Vss) so as to speed-up a falling transition of the bitlines. Also, the zero-bit connections may provide for data encoding that speeds-up the local discharge of the source lines (SL0 ... SLm) during a falling transition of the wordlines (WL0 ... WLm).

In some implementations, the memory circuitry 300 may include the number (n+1) of sense amplifiers (SA0 ... SAn) along with a flag sense amplifier (SAF) for the flag column (col_f). The sense amplifiers (SA0 ... SAn) may be arranged to receive bitline signals from the bitlines (BL0 ... BLn) along with a voltage reference signal (Vref) and provide output signals (Q0/QN0 ... Qn/QNn). The flag sense amplifier (SAF) may be arranged to receive the flag bitline signal from the flag bitline (BLF) along with the voltage reference signal (Vref) and provide the output signal (Qinv), which may be used as a control selection signal. As also shown, the memory circuitry 300 may include the number (n+1) of multiplexers (mux_0 ... mux_n) that are arranged to receive the output signals (Q0/QN0 ... Qn/QNn and Qinv) from the sense amplifiers (SA0 ... SAn and SAF) along with the voltage reference signal (Vref) and provide read-out signals (read-out [0] ... read-out [n]) as output based on the output signal (Qinv) from the flag sense amplifier (SAF), which may be used as the control selection signal.

In some implementations, in reference to FIG. 3, switched source-line ROM with low Vmin using 0-bits as local discharge path may be implemented to shorten access time. Also, data encoding (e.g., as shown in reference to Matrix 1 below) may be used to ensure that a number of local discharge paths in a physical row is more than half. For instance, this data encoding may ensure that local discharge paths created by 0-bits are at least greater than or equal to the 1-bits in any physical row. In other instances, although a threshold may be used as half for enabling data encoding in the example matrix 1, this threshold may be selected to be a smaller/larger value, Also, the threshold limit, or ratio of 1 bits:0 bits may be used to tradeoff access speed and leakage power of memory. Hence, the SL drivers 108 may be made wider by a number of bitcells with value '0', which may act as local discharge paths to ground (Vss). Therefore, in some instances, access time of the memory circuitry 300 in FIG. 3 may approach conventional ROM speed.

Further, in reference to Matrix 1 provided herein below, data encoding may be used to improve performance by making worst case scenarios closer to an average case scenario. In this instance, data encoding may be used to ensure the use of enough pull-down transistors in each physical row, and improving the worst case scenario (from all 1s to maximum half 1s) is an advantageous result of this data encoding with SSL technique.

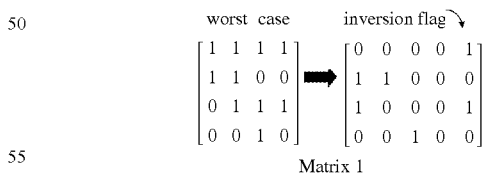

Matrix 1

Figure 4:
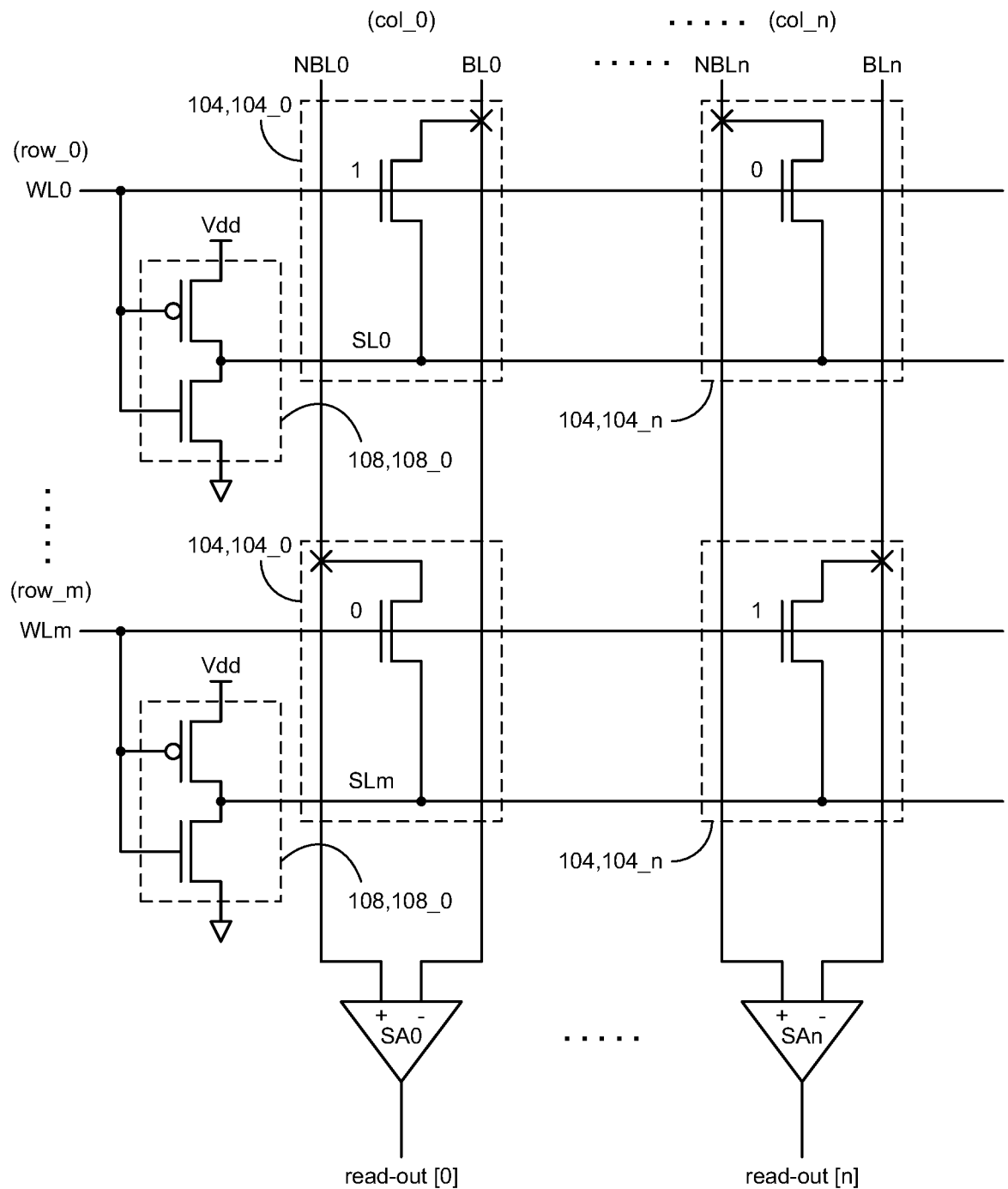
FIG. 4 illustrates another diagram of memory circuitry having switched source lines in accordance with various implementations described herein.

FIG. 4 illustrates another diagram of memory circuitry 400 having switched source lines in accordance with implementations described herein. Various components that are described herein below in FIG. 4 are similar in scope, function, and operation as described in reference to the memory circuitry 100A as shown in FIG. 1A.

As shown in FIG. 4, the memory circuitry 400 may be implemented with a memory structure having an array of bitcells 104 that are accessible via the number (m+1) of wordlines (WL0 ... WLm) and the number (n+1) of complementary bitlines (NBL0/BL0 . . . NBL/BLn). The wordlines (WL0 . . . WLm) may be arranged in the number (m+1) of rows (row_0 . . . row_m), and the complementary bitlines (NBL0/BL0 . . . NBL/BLn) may be arranged in the number (n+1) of columns (col_0 . . . col_n). As shown, one or more bitcells 104 are coupled to first bitlines (BL0 . . . BLn) of the bitlines (NBL0/BL0 . . . NBL/BLn) with a short (X) to the first bitlines (BL0 . . . BLn), and one or more other bitcells 104 are coupled to second bitlines (NBL0 . . . NBLn) of the bitlines (NBL0/BL0 . . . NBL/BLn) with a short (X) to the second bitlines (NBL0 . . . NBLn).

In some instances, the memory structure may be implemented as a read-only memory (ROM) structure, and the array of bitcells 104 may be implemented as a ROM array. For instance, as shown in FIG. 4, each bitcell 104 in the array of bitcells may be implemented with a single transistor that is coupled between a corresponding bitline (BL or NBL) of the bitlines (NBL0/BL0 . . . NBL/BLn) and a corresponding source line (SL) of the source lines (SL0 . . . SLm). In various instances, the single transistor may be implemented with a single NMOS transistor (as shown) or a single PMOS transistor.

The memory circuitry 400 may include the number (m+1) of source lines (SL0 . . . SLm) that are coupled to the bitcells 104. Also, the memory circuitry 400 may include the number (m+1) of source line drivers 108 (i.e., 108_0 . . . 108_m) that are coupled between the wordlines (WL0 . . . WLm) and the source lines (SL0 . . . SLm). In some instances, the source line drivers (108_0 . . . 108_m) may allow the source lines (SL0 SLm) to be used as switched source lines (SSLs).

In some implementations, each bitcell 104 in the array of bitcells may be coupled between a corresponding source line (SL) of the source lines (SL0 . . . SLm) and a corresponding first bitline (BL0 . . . BLn) of the bitlines (NBL0/BL0 . . . NBLn/BLn) or a corresponding second bitline (NBL0 . . . NBLn) of the bitlines (NBL0/BL0 . . . NBLn/BLn). As shown, each bitcell 104 in the array of bitcells may store a logic data value of one (1) with a connection or short (X) between each bitcell 104 and the corresponding first bitline (BL0 . . . BLn), and also, each bitcell 104 in the array of bitcells may store another logic data value of zero (0) with a connection or short (X) between each bitcell 104 and the corresponding second bitline (NBL0 . . . NBLn).

In some implementations, the memory circuitry 300 may include the number (n+1) of sense amplifiers (SA0 . . . SAn) that are arranged to receive bitline signals from the bitlines (NBL0/BL0 . . . NBLn/BLn) and provide read-out signals (read-out [0] . . . read-out [n]) as output.

In some implementations, in reference to FIG. 4, the switched source lines (SSLs) are used to reduce Ioff from unselected rows, and the memory circuitry 400 may also use differential read to improve read margins. For instance, bitcells storing logic 1 may couple (or connect) to the first bitlines (BL), while bitcells storing logic 0 may couple (or connect) to the second bitlines (NBL). The sense amplifiers (SA0 . . . , San) may sense the difference in potential between first bitlines (BL) and the second bitlines (NBL).

In addition, the SSL technique shown in FIG. 4 may involve driving the source line (SL) as an inverse of the wordline (WL). This SSL technique may ensure that only the selected (WL=1, SL=0) row bitcells are pulling down Ion, while the unselected (WL=0, SL=1) row bitcells do not leak down. Hence, this SSL technique may improve the read margin from Ion/m*Ioff to Ion/Ioff and eliminate 'm' from the equation, which may allow several bits per BL or NBL. The number of bits on a bitline may be limited only by read speed, which may thus enable the design of high density, low Vmin ROM. Therefore, in some instances, the switched source-line ROM with differential read may be used to obtain low Vmin with the logic 1-bits connected to BL and with the logic 0-bits connected to NBL. In this instance, the differential read may improve both robustness and sensing speed.

In some implementations, the differential ROM may be biased more towards speed, if the SL is tied to ground (Vss). This may take away the Vmin benefits due to use of the switched source line (SSL), but the 1T differential read ROM may still provide speed improvement, robustness and some Vmin improvement over single-ended conventional ROM, without the large area impact of a true 2T differential bitcell.

Therefore, in reference to FIG. 4, various implementations described herein may provide for memory circuitry and structures (e.g., ROM) with switched source lines (SSLs) to provide for differential read ROM using single transistor bitcells to improve both speed and robustness. Also, implementations described herein may provide for switched source line ROM to reduce the minimum voltage of operation (Vmin).

Described herein are various implementations of an integrated circuit. The integrated circuit may include a memory structure having an array of bitcells accessible via wordlines arranged in rows and bitlines arranged in columns. The integrated circuit may include source lines coupled to the bitcells. The integrated circuit may include source line drivers coupled between the wordlines and the source lines. The source line drivers may allow the source lines to be used as switched source lines.

Described herein are various implementations of an integrated circuit. The integrated circuit may include a memory structure having an array of bitcells accessible via wordlines arranged in rows and bitlines arranged in columns. The integrated circuit may include floating source lines coupled to the bitcells, and each bitcell in the array of bitcells may be coupled between a corresponding floating source line of the floating source lines and a corresponding bitline of the bitlines.

Described herein are various implementations of an integrated circuit. The integrated circuit may include a memory structure having an array of bitcells accessible via wordlines arranged in rows and bitlines arranged in columns along with ground lines. One or more bitcells may be coupled to the bitlines, and one or more other bitcells may be coupled to the ground lines. The integrated circuit may include source lines coupled to the bitcells. The integrated circuit may include source line drivers coupled between the wordlines and the source lines. The source line drivers may allow the source lines to be used as switched source lines.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
a memory structure having an array of bitcells accessible via wordlines arranged in rows and bitlines arranged in columns;
source lines coupled to the bitcells; and
source line drivers coupled between the wordlines and the source lines, wherein the source line drivers allow the source lines to be used as switched source lines, and wherein each source line driver of the source line drivers is implemented with an inverter coupled between a voltage supply and ground.

2. The integrated circuit of claim 1, wherein the memory structure comprises a read-only memory (ROM) structure or a random access memory (RAM) structure, and wherein the array of bitcells comprises a ROM array or a RAM array.

3. The integrated circuit of claim 1, wherein each row of the rows includes a number of bitcells, a corresponding source line of the source lines, and a corresponding source line driver of the source line drivers.

4. The integrated circuit of claim 1, wherein each bitcell in the array of bitcells is coupled between a corresponding source line of the source lines and a corresponding bitline of the bitlines.

5. The integrated circuit of claim 4, wherein each bitcell in the array of bitcells stores a logic data value of one (1) with a short between each bitcell and the corresponding bitline, and wherein each bitcell in the array of bitcells stores another logic data value of zero (0) with an open between each bitcell and the corresponding bitline.

6. The integrated circuit of claim 1, wherein the wordlines comprise active wordlines and inactive wordlines, and wherein an initial condition of the source lines of the inactive wordlines is similar to an initial condition of any one bitline of the bitlines.

7. The integrated circuit of claim 1, wherein the source line drivers operate to reduce leakage of the bitcells so as to increase a read margin associated with read operations of the bitcells, and wherein the increase in read margin is associated with at least one of an off-current through the bitlines and a precharge voltage of the bitlines.

8. An integrated circuit, comprising:
a read-only memory (ROM) structure having an array of ROM bitcells accessible via wordlines arranged in rows and bitlines arranged in columns;
source lines coupled to the ROM bitcells; and
source line drivers coupled between the wordlines and the source lines, wherein the source line drivers allow the source lines to be used as switched source lines, wherein the source line drivers are implemented with logic devices, and wherein each logic device of the logic devices is implemented with a single transistor coupled between a voltage supply and a corresponding source line of the source lines.

9. An integrated circuit, comprising:
a read-only memory (ROM) structure having an array of ROM bitcells accessible via wordlines arranged in rows and bitlines arranged in columns; and
floating source lines coupled to the bitcells, wherein each ROM bitcell in the array of ROM bitcells is coupled between a corresponding floating source line of the floating source lines and a corresponding bitline of the bitlines or ground.

10. The integrated circuit of claim 9, wherein each ROM bitcell has a single transistor with a gate coupled to a corresponding wordline of the wordlines.

11. The integrated circuit of claim 9, wherein each ROM bitcell in the array of ROM bitcells stores a logic data value of one (1) with a short between each ROM bitcell and the corresponding bitline, and wherein each ROM bitcell in the array of ROM bitcells stores another logic data value of zero (0) with a short between each ROM bitcell and ground.

12. An integrated circuit, comprising:
a read-only memory (ROM) structure having an array of (ROM) bitcells accessible via wordlines arranged in rows and bitlines arranged in columns along with ground lines, wherein one or more (ROM) bitcells are coupled to the bitlines, and wherein one or more other (ROM) bitcells are coupled to the ground lines;
source lines coupled to the (ROM) bitcells; and
source line drivers coupled between the wordlines and the source lines, wherein the source line drivers allow the source lines to be used as switched source lines.

13. The integrated circuit of claim 12, wherein each ROM bitcell has a single transistor with a gate coupled to a corresponding wordline of the wordlines, and wherein each source line driver of the source line drivers is implemented with an inverter coupled between a voltage supply and ground.

14. The integrated circuit of claim 12, wherein each (ROM) bitcell in the array of (ROM) bitcells is coupled between a corresponding source line of the source lines and a corresponding bitline of the bitlines or a corresponding ground line of the ground lines.

15. The integrated circuit of claim 14, wherein each (ROM) bitcell in the array of (ROM) bitcells stores a logic data value of one (1) with a connection between each (ROM) bitcell and the corresponding bitline, and wherein each (ROM) bitcell in the array of (ROM) bitcells stores another logic data value of zero (0) with a connection between each (ROM) bitcell and the corresponding ground line.

16. An integrated circuit, comprising:
a memory structure having an array of bitcells accessible via wordlines arranged in rows and bitlines arranged in columns along with ground lines, wherein one or more bitcells are coupled to the bitlines, and wherein one or more other bitcells are coupled to the ground lines;
source lines coupled to the bitcells; and
source line drivers coupled between the wordlines and the source lines, wherein the source line drivers allow the source lines to be used as switched source lines, and
wherein the array of bitcells includes one or more columns of flag bitcells, and wherein the bitlines include a flag bitline for providing an inversion flag for data encoding with the column of flag bitcells, and wherein the one or more flag columns of bitcells provide for data encoding that speeds-up discharge during a falling transition of the bitlines.

17. An integrated circuit, comprising:
a memory structure having an array of bitcells accessible via wordlines arranged in rows and bitlines arranged in columns along with ground lines, wherein one or more bitcells are coupled to the bitlines, and wherein one or more other bitcells are coupled to the ground lines;
source lines coupled to the bitcells; and
source line drivers coupled between the wordlines and the source lines, wherein the source line drivers allow the source lines to be used as switched source lines, and
wherein the wordlines comprise active wordlines and inactive wordlines, and wherein the one or more other bitcells that are coupled to the ground lines provide zero-bit connections for local discharge of the source lines that are coupled to the active wordlines, and wherein the zero-bit connections provide for local discharge path of the source lines to ground so as to speed-up a falling transition of the bitlines.

18. An integrated circuit, comprising:
a memory structure having bitcells with a single transistor accessible via wordlines arranged in rows and complementary bitlines arranged in columns, wherein one or more bitcells are coupled to first bitlines (BL) of the complementary bitlines, and wherein one or more other bitcells are coupled to second bitlines (NBL) of the complementary bitlines;
source lines coupled to the wordlines and the bitcells; and
source line drivers coupled between the wordlines and the source lines, wherein the source line drivers allow the source lines to be used as switched source lines.

19. The integrated circuit of claim 18, wherein each bitcell in the array of bitcells is coupled between a corresponding source line of the source lines and a corresponding first bitline (BL) of the complementary bitlines or a corresponding second bitline (NBL) of the complementary bitlines.

20. The integrated circuit of claim 19, wherein each bitcell in the array of bitcells stores a logic data value of one (1) with a connection between each bitcell and the corresponding first bitline (BL), and wherein each bitcell in the array of bitcells stores another logic data value of zero (0) with a connection between each bitcell and the corresponding second bitline (NBL).

* * * * *